(12) United States Patent
Darabi

(10) Patent No.: US 7,103,113 B2
(45) Date of Patent: Sep. 5, 2006

(54) ANALOG FSK MODULATOR FOR A RADIO TRANSMITTER

(75) Inventor: Hooman Darabi, Long Beach, CA (US)

(73) Assignee: Broadcom Corporation, Irvine, CA (US)

(*) Notice: Subject to any disclaimer, the term of this patent is extended or adjusted under 35 U.S.C. 154(b) by 729 days.

(21) Appl. No.: 10/183,582

(22) Filed: Jun. 26, 2002

(65) Prior Publication Data

US 2004/0001560 A1    Jan. 1, 2004

(51) Int. Cl.
*H03C 3/00*    (2006.01)

(52) U.S. Cl. ......................... 375/303; 332/100

(58) Field of Classification Search .......... 375/303, 375/302, 295, 334, 322, 316; 331/43, 42, 331/37, 108 C, 108 D, 108 R, 107 R; 455/189.1, 455/188.1, 150.1, 130; 330/307, 250; 332/100
See application file for complete search history.

(56) References Cited

U.S. PATENT DOCUMENTS 6,154,485 A * 11/2000 Harrison ................. 375/130
6,317,410 B1 * 11/2001 Allpress et al. ............ 370/203

* cited by examiner

*Primary Examiner*—Pankaj Kumar
(74) *Attorney, Agent, or Firm*—Garlick Harrison & Markison; James A. Harrison

(57) ABSTRACT

A transceiver includes a transmitter portion with an analog modulator that modulates data using frequency shift keyed (FSK) modulation techniques to increase efficiency, reduce power consumption, and reduce IC real estate in comparison to current digital FSK modulation circuits. The analog modulator comprises a loop that includes a pair of integrators and a pair of mixers. In at least one embodiment, the pair of mixers comprises switches that control a polarity of a modulated output signal that is produced to an up-conversion module for up-conversion to RF. The up-conversion module, then, when mixing the modulated output signal with a local oscillation signal, produces an output having one of two possible frequencies wherein the frequencies are a function of the polarity of the modulated output signal. In one embodiment of the invention, the analog modulator comprises differential circuitry, including a plurality of differential switches for cross-connecting input signals to one of a pair of inputs of an amplifier within each of a pair of integrators. Thus, the polarity of the modulated output signal is, at least in part, a function of whether a given signal is input to a positive or a negative terminal of the amplifier within the pair of integrators.

32 Claims, 9 Drawing Sheets

Analog FSK Modulator

Analog FSK Modulator

Differential Analog FSK Modulator

RF Transmitter with Analog FSK Modulator

Transmitter with Differential Analog FSK Modulator

Data Driven Resistor Module

ANALOG FSK MODULATOR FOR A RADIO TRANSMITTER

TECHNICAL FIELD OF THE INVENTION

This invention relates generally to wireless communication systems and, more particularly, to radio frequency (RF) transmitters used within such wireless communication systems.

DESCRIPTION OF RELATED ART

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with one or more local oscillations to convert the amplified RF signals into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

FIG. 1 illustrates a frequency shift keying (FSK) based transmitter of the prior art. The transmitter includes a digital sine wave generator that may be implemented utilizing a direct digital frequency synthesizer (DDFS), digital to analog converters, low pass filters, mixers, a summing module, and a power amplifier. The digital sine wave generator receives digital input data, filters the data using a digital Gaussian low pass filter that is clocked at 24 megahertz, and generates a digital in-phase component and a digital quadrature component based on the filtered data. The instantaneous frequency of the in-phase and quadrature components of the modulation frequency, which is the frequency deviation for FSK (frequency shift keying) modulation, is denoted as $\omega_d$. For example, as shown in FIG. 2, when the digital input data is a logic 1, the digital sine wave generator produces a digital cosine wave at its $1^{st}$ output and a digital sine wave at its $2^{nd}$ output. The $1^{st}$ output is processed via a digital to analog converter and a low pass filter and then mixed via a mixer with a cosine signal having a frequency at the radio frequency, i.e., cos $(\omega_{RF})$t, which corresponds to an in-phase component of a local oscillation. The $2^{nd}$ output of the digital sine wave generator is processed by another digital to analog converter and another low pass filter and mixed with a sine wave having a frequency at the radio frequency, i.e., sin $(\omega_{RF})$t, which corresponds to a quadrature component of a local oscillation. As shown in FIG. 2, the output of the mixers are summed, producing a cosine waveform having a frequency that is the sum of the local oscillation $(\omega_{RF})$ and the modulating frequency $(\omega_d)$. For example, for FSK modulation as used in a Bluetooth application, the modulating frequency is 166 kilohertz.

When the digital input data is a logic 0, the digital sine wave generator produces a cosine wave on its $1^{st}$ output and a negative sine wave on its $2^{nd}$ output. These outputs are processed by the respective digital to analog converters and low pass filters and presented as analog sine and cosine waveforms to the mixers. FIG. 3 illustrates the mixing of the cosine wave of the data with a cosine wave of the local oscillation and the mixing of the negative sine wave of the data with the sine wave of the local oscillation. The outputs of the mixers are summed producing a cosine wave that has a frequency that is the radio frequency $(\omega_{RF})$ minus the modulating frequency $(\omega_d)$. As such, for a digital input of 1, the resulting radio frequency signal is the local oscillation $(\omega_{RF})$ plus the modulating frequency $(\omega_d)$ and for a logic 0 the resulting frequency is the radio frequency $(\omega_{RF})$ minus the modulating frequency $(\omega_d)$. Thus, for an FSK Bluetooth application, for example, a logic 1 is represented by a cosine wave having its instantaneous frequency equal to the radio frequency plus 166 kilohertz and a logic 0 is represented by a cosine wave having its instantaneous frequency equal to the radio frequency minus 166 kilohertz.

The digital modulator as shown in FIGS. 1, 2 and 3 are effective but consume significant circuitry and IC real estate. Additionally, additional power is required to operate such circuitry thereby reducing battery life for portable devices.

There is a need, therefore, for a transmitter with a modulator that is more efficient, uses less power, and consumes less IC real estate.

BRIEF SUMMARY OF THE INVENTION

A transceiver includes a transmitter portion with an analog modulator that modulates data using frequency shift keyed (FSK) modulation techniques to increase efficiency, reduce power consumption, and reduce IC real estate in comparison to current digital FSK modulation circuits. The analog modulator comprises a loop that includes a pair of integrators and a pair of mixers. In at least one embodiment, the mixers comprise switches that control a polarity of a modulated output signal that is produced to a mixer for up-conversion to RF. The mixer, then, when mixing the modulated output signal with a local oscillation signal, produces an output having one of two possible frequencies wherein the frequencies are a function of the polarity of the modulated output signal.

In one embodiment of the invention, the analog modulator comprises differential circuitry including a plurality of differential switches for cross-connecting input signals to one of a pair of inputs of an amplifier within each of a pair of integrators. Thus, the polarity of the output modulated signal is, at least in part, a function of whether a given signal is input to a positive or negative terminal of the amplifiers within the plurality of integrators.

DETAILED DESCRIPTION OF THE INVENTION

Figure 1:
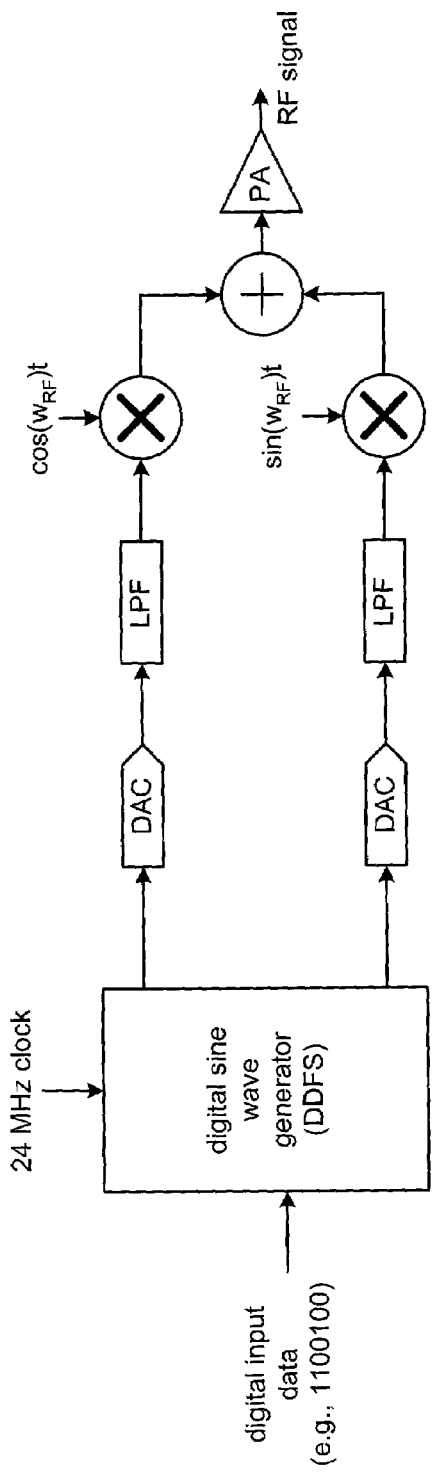
FIGS. 1–3 illustrate a prior art FSK based transmitter.
Figure 3:
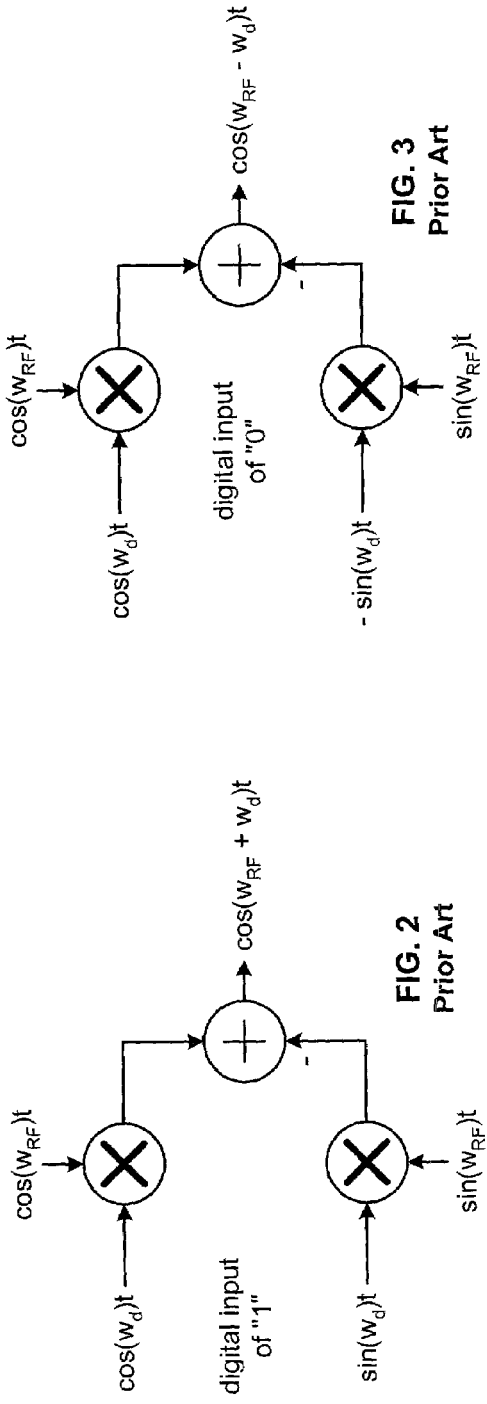
Figure 2:
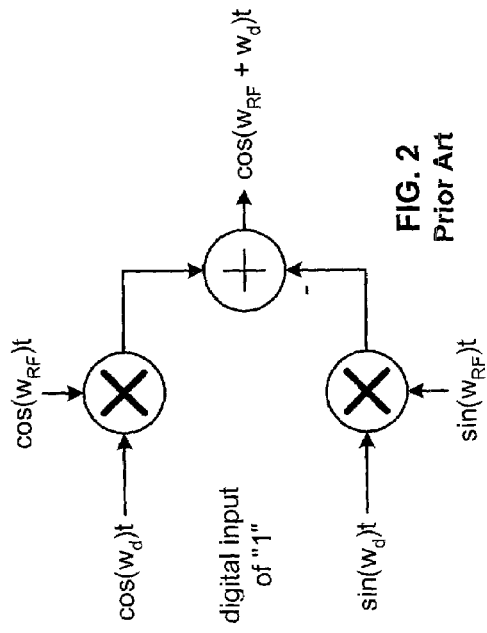
Figure 4:
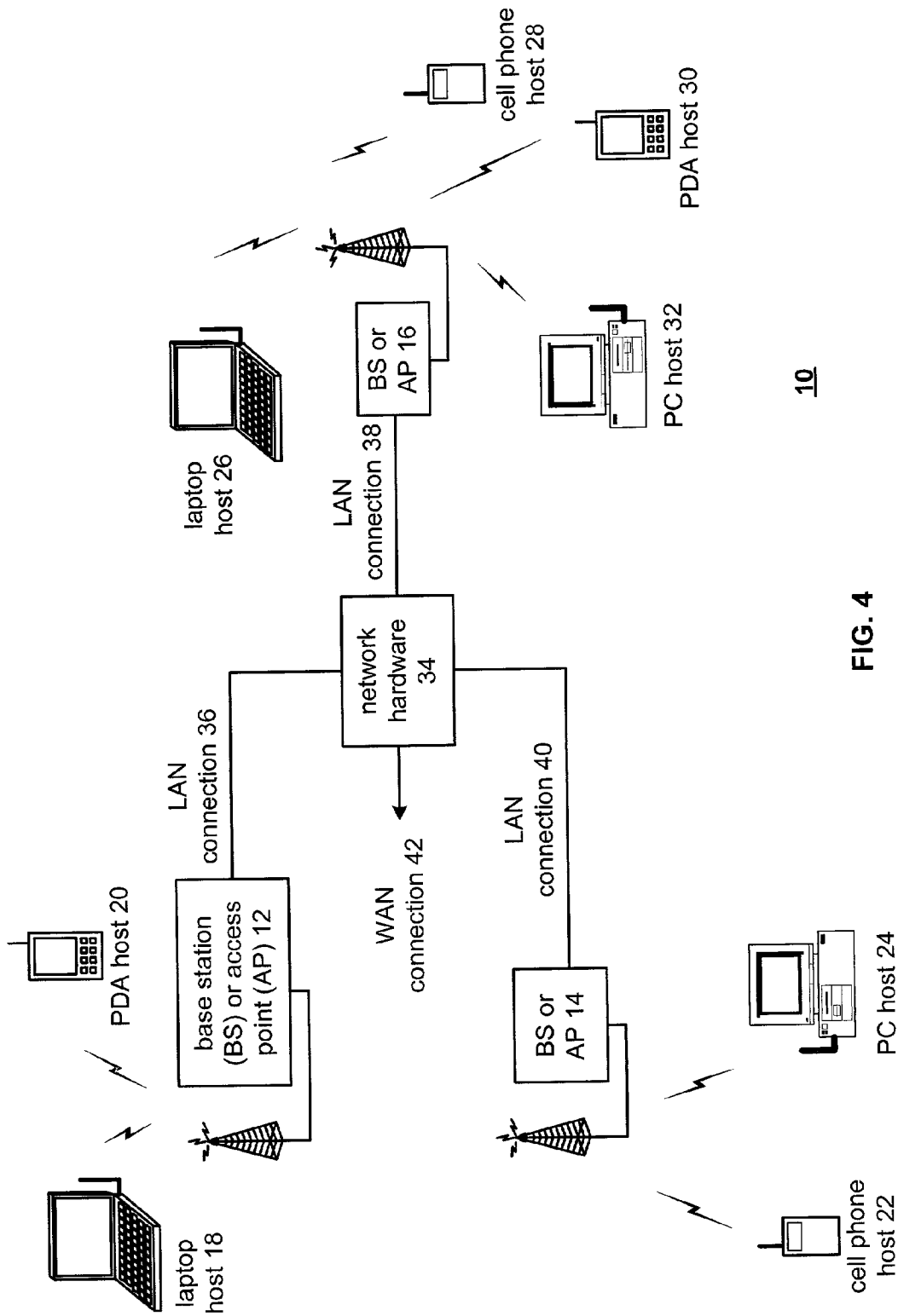
FIG. 4 is a schematic block diagram illustrating a communication system that includes a plurality of base stations and/or access points, a plurality of wireless communication devices and a network hardware component formed according to one embodiment of the invention.

FIG. 4 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 5.

The base stations or access points 12–16 are operably coupled to the network hardware component 34 via local area network connections 36, 38 and 40. The network hardware component 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices 18–32 register with a particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 5:
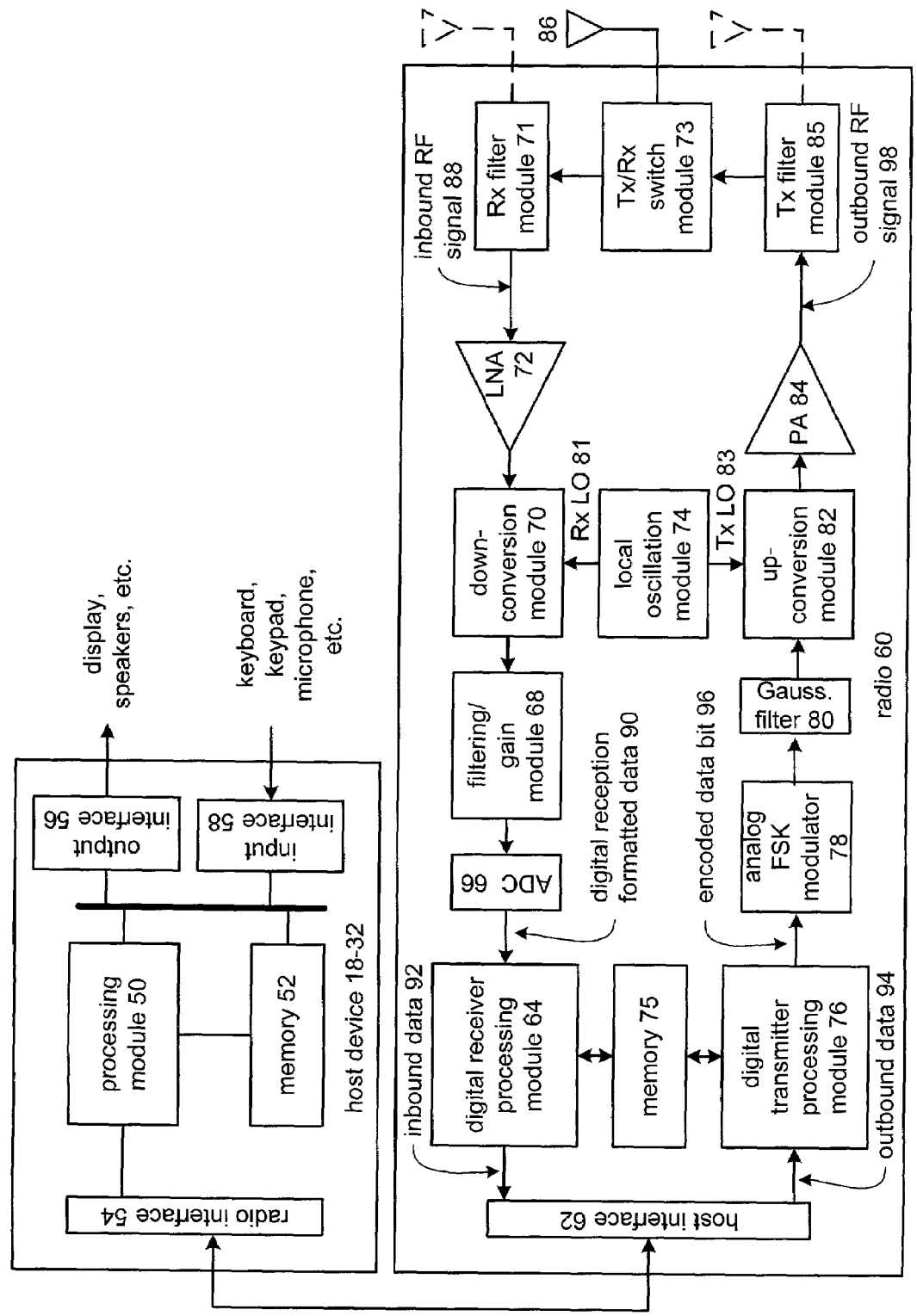
FIG. 5 is a schematic block diagram illustrating a wireless communication device that includes a host device and an associated radio formed according to one embodiment of the invention.

FIG. 5 is a schematic block diagram illustrating a wireless communication device that include the host wireless communication devices 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, a down conversion module 70, a receiver filter module 71, a low noise amplifier 72, a transmitter/receiver switch 73, a local oscillation module 74, memory 75, a digital transmitter processing module 76, an analog FSK modulator 78, a Gaussian filter module 80, an up-conversion module 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11, IEEE 802.11b, Bluetooth, et cetera) to produce encoded data bit 96.

The analog FSK modulator 78 modulates an analog signal according to a logic value of the encoded data bits 96. The Gaussian filter module 80 filters the analog signal to smooth the transitions as is known by one of average skill in the art prior to providing the filtered analog signal to the up-conversion module 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device. The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/attenuation module 68. The filtering/gain module 68 filters and/or attenuates the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host communication devices 18–32 via the radio interface 54.

As one of average skill in the art will appreciate, the wireless communication device of FIG. 5 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing modules 64 and 76.

Figure 6:
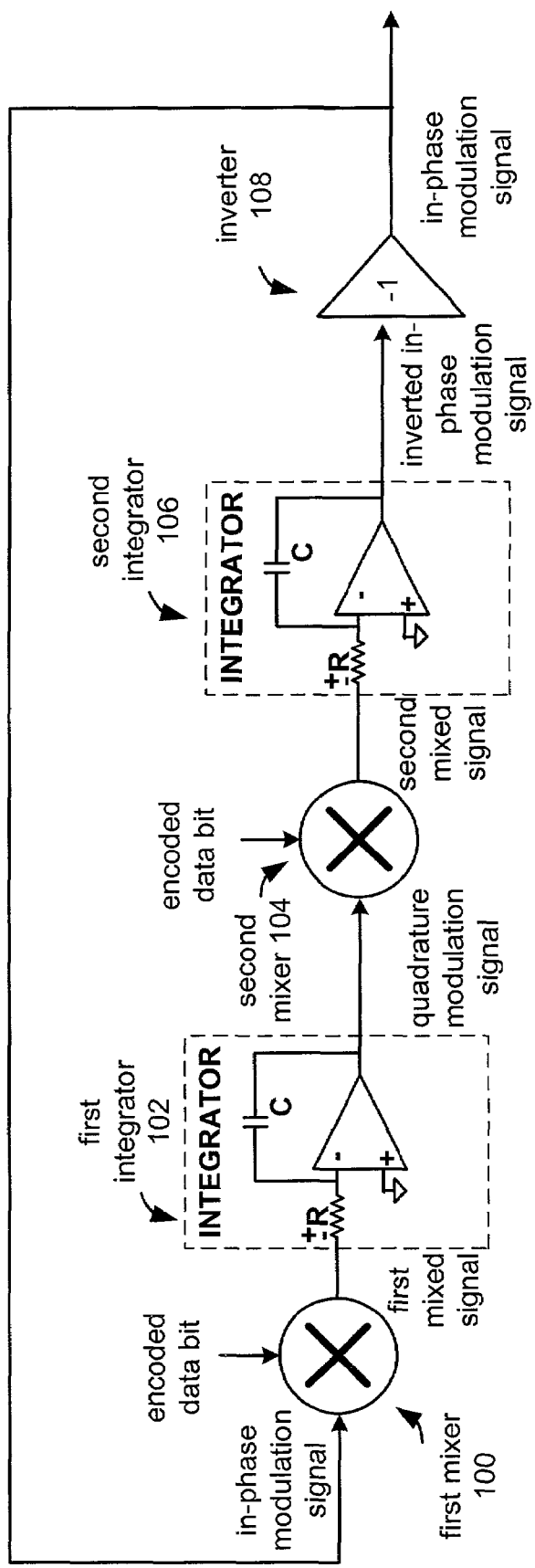
FIG. 6 is a functional schematic block diagram of an analog frequency shift keyed (FSK) modulator according to one embodiment of the present invention.

FIG. 6 is a functional schematic diagram of an analog FSK modulator according to one embodiment of the present invention. A first mixer 100 is coupled to receive, in a feedback loop, an in-phase modulation signal produced as an output of analog FSK modulator 78. First mixer 100 further is coupled to receive an encoded data bit and generates an output responsive thereto, which output comprises a first mixed result.

A first integrator 102 is coupled to receive the first mixed signal. First integrator 102 integrates the first mixed signal to produce a quadrature modulation signal to a second mixer 104. Second mixer 104 further is coupled to receive the encoded data bit and produces a second mixed result responsive to a value of the encoded data bit.

A second integrator 106 is coupled to receive and integrate the second mixed result produced by the second mixer 104 to produce an inverted in-phase modulation signal which, in turn, is produced to an inverter 108. Inverter 108 then produces an in-phase modulation signal.

Each of the first and second integrators 102 and 106 include resistive and capacitive elements that, combined, form an RC time constant that results in a frequency of oscillation that approximately matches a desired frequency of oscillation for the analog FSK modulator 78 of FIG. 6. Additionally, as is understood by one of average skill in the art, the analog FSK modulator 78 serves to operate as a ring oscillator as a result of the feedback from the output of inverter 108 to the input of first mixer 100.

In one embodiment of the present invention, the encoded data bits may be in the form of a sinusoid and may be mixed with the in-phase modulation signal as is known by one of average skill in the art. In another embodiment of the present invention, the encoded data bits are binary "1"s and "0"s and the mixers are switches that couple a switch input to one of a pair of amplifier inputs (positive or negative) based upon the value of the encoded data bit. Thus, in this embodiment, the encoded data bits affect the polarity of the signals that are output from the first and second integrators 102 and 106. The polarity of the in-phase modulation signal then, when mixed with a downstream mixer, such as one within up-conversion module 82 affects an output frequency of an up-converted signal. Accordingly, in an FSK modulation, the changes in output frequency of the up-converted signal represent the binary "1" or "0" received as an encoded data bit. Because the encoded switches affect the coupling and, more particularly, whether a signal is produced to the positive or negative input of either first integrator 102 or second integrator 106, the resistor is shown as ±R.

Figure 7:
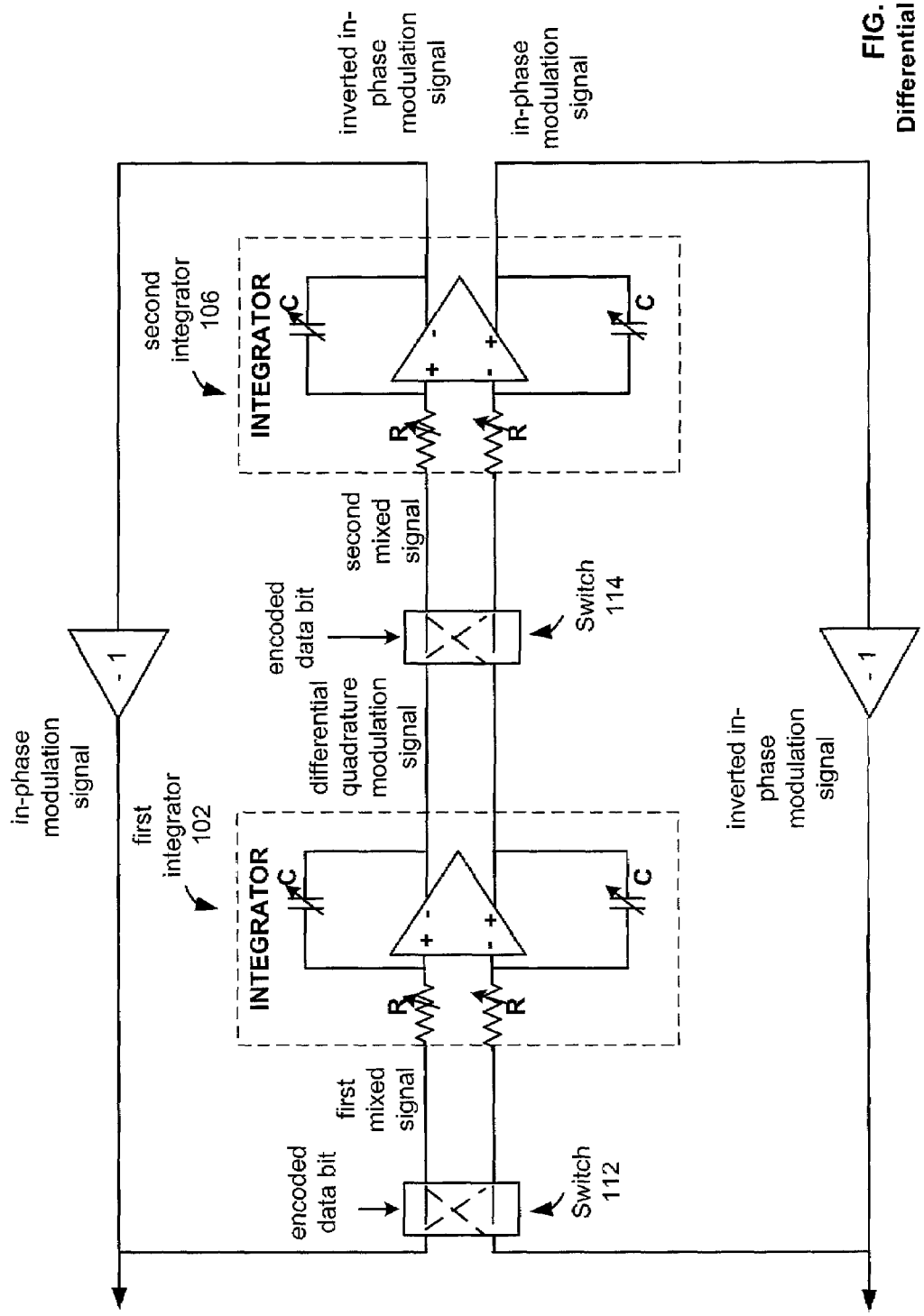
FIG. 7 illustrates a functional schematic diagram of a differential analog frequency shift keyed (FSK) modulator formed according to one embodiment of the present invention.

FIG. 7 illustrates a functional schematic diagram of a differential analog FSK modulator formed according to one embodiment of the present invention. The functionality of mixer 102 of FIG. 6 is replaced in FIG. 7 with dual input and dual output cross coupling switches 112 and 114. For a first data bit value of the encoded data bit, switches 112 and 114 merely pass through the signals received at the two input terminals referenced herein as the positive and negative input terminals. The signals input to the positive and negative input terminals are produced from positive and negative output terminals of switches 112 and 114. For a second data bit value for the encoded data bit, switches 112 and 114 cross couple the inputs with the outputs. Thus, a signal received at a positive input is produced at the negative output and, therefore, to the negative input of an amplifier within a respective integrator (first and second integrators 102 or 106, respectively).

Switch 112 produces a first mixed signal (differential) that is fed into first integrator 102. In the circuit of FIG. 7, first integrator 102 includes an amplifier configured to operate as a differential amplifier and produces a differential quadrature modulation signal. The differential quadrature modulation signal is then produced to switch 114 that, in turn, produces a second mixed signal. The second mixed signal is then produced to second integrator 106 that also includes an amplifier configured to operate as a differential amplifier and produces a differential in-phase modulation signal.

The differential in-phase modulation signal then is produced to a pair of inverters that invert the outputs of second integrator 106. Thus, the inverted in-phase modulation signal is inverted to produce an in-phase modulation signal. The in-phase modulation signal produced by second integrator 106 is inverted to produce an inverted in-phase modulation signal. The in-phase and inverted in-phase modulation signals are then produced to the positive and negative inputs of switch 112. In an alternate embodiment of the invention, the in-phase modulation signals produced by second integrator 106 are not produced to a pair of inverters. Rather, they are produced to the negative and positive input terminals of switch 112, respectively. Thus, the desired effect is achieved by cross-connecting the output signals of second integrator 106 to polar opposite inputs of switch 112.

Figure 8:
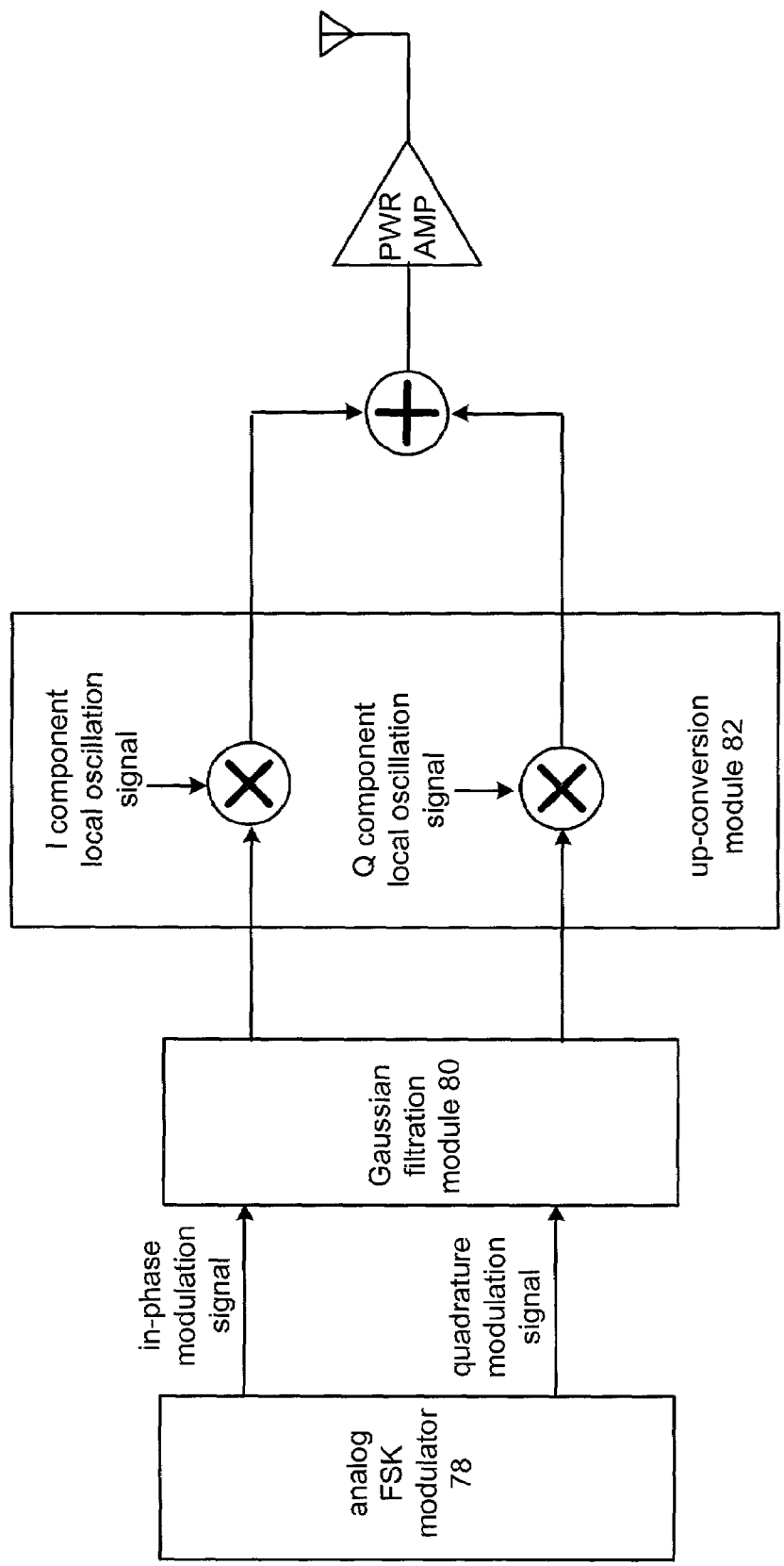
FIG. 8 is a functional block diagram of a radio frequency (RF) transmitter with an analog frequency shift keyed (FSK) modulator according to one embodiment of the present invention.

FIG. 8 is a functional block diagram of an RF transmitter with an analog FSK modulator according to one embodiment of the present invention. Analog FSK modulator 78 produces an in-phase modulation signal and a quadrature modulation signal to a Gaussian filtration module 80. Gaussian filtration module 80 filters out corners or sharp transition points as is known by one of average skill in the art. In the described embodiment of the invention, the binary frequency shift keyed (BFSK) data is produced by the analog FSK modulator output and then passed through the Gaussian filter. The disclosed design facilitates placing the Gaussian filter down stream from the analog FSK modulator. In the prior art, the Gaussian Filter is placed upstream (prior) to a modulator. To so, however, is very complicated and requires significantly more circuitry and IC real estate than the present design because a filtered Gaussian data stream must be produced and fed to the modulator. Thus, the present design, because it allows the Gaussian filter to be placed down stream, is more efficient and is simpler.

Gaussian filtration module 80 then produces the filtered in-phase and quadrature modulation signals to up-conversion module 82. Up-conversion module 82 comprises a pair of mixers that receive the in-phase modulation signal and the quadrature modulation signal. The mixer that receives the in-phase modulation signal further is coupled to receive an I component local oscillation signal to produce an up-converted I component RF signal. The mixer that receives the quadrature modulation signal also is coupled to receive a Q component local oscillation signal to produce an up-converted Q component RF signal.

The pair of mixers then produce the up-converted I and Q component RF signals to an adder that produces an outgoing RF signal. The outgoing RF signal is then produced to a power amplifier, as is known by one of average skill in the art, to amplify the outgoing RF for transmission from an antenna.

Because the present transmitter utilizes FSK modulation, the frequency of the RF corresponding to a given logic value is represented by the RF. Moreover, the frequency of the RF specifically corresponds to the encoded data bit value received by the mixers/switches of the analog FSK modulator as described above. The polarity of the output signal from the inverter, when mixed with the local oscillation in the up-conversion module affects the output frequency of the signal produced to the power amp by the mixers.

Figure 9:
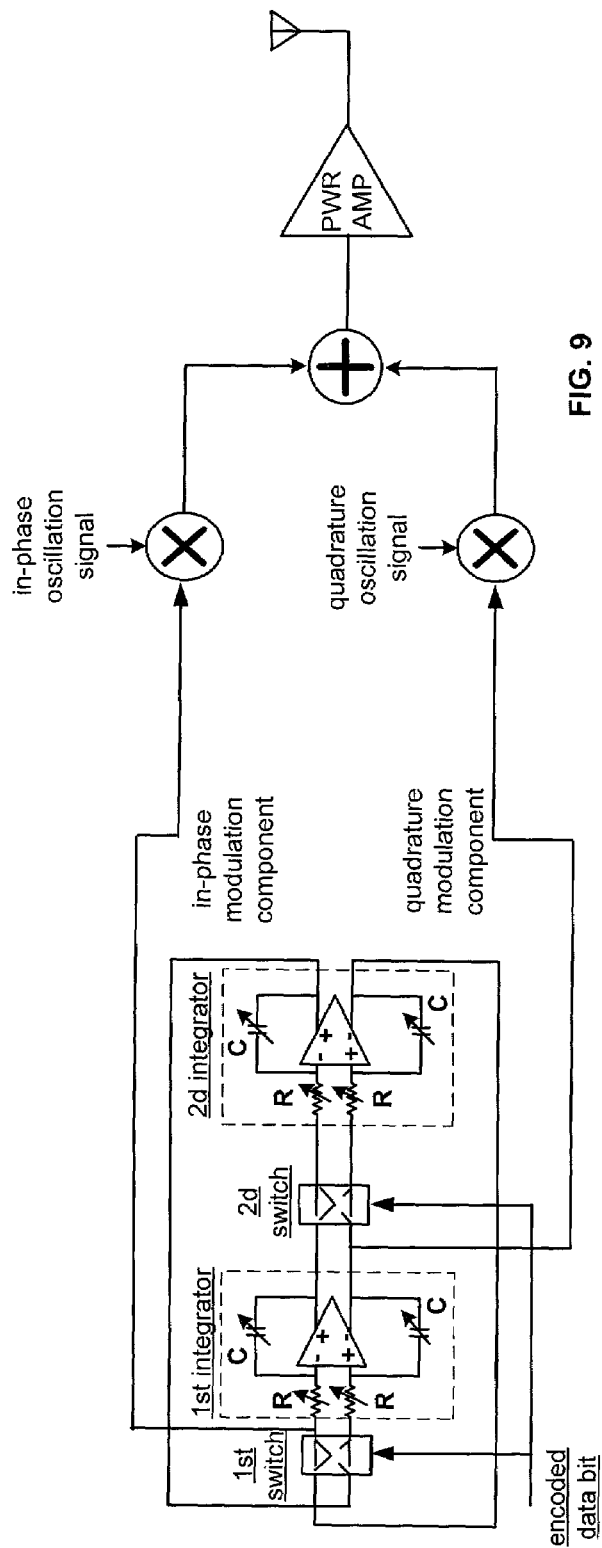
FIG. 9 is a schematic block diagram of a transmitter with a differential analog modulator formed according to one embodiment of the present invention.

FIG. 9 is a schematic block diagram of a transmitter with a differential analog modulator formed according to one embodiment of the present invention. The differential analog FSK modulator of the transmitter of FIG. 9 is similar to the differential analog FSK modulator of FIG. 7. One difference, however, is that the pair of inverters of FIG. 7 are not included in the schematic of FIG. 9. To increase circuit efficiency, the circuit of FIG. 9 routes outputs from second integrator 106 to opposite polarity inputs of first switch 112 of the differential analog FSK modulator. Thus, the polarity is inverted by inputting the outputs of second integrator 106 into polar opposite inputs of the first switch and therefore of first integrator 102.

As may also be seen, the in-phase and quadrature modulation components produced by the differential analog FSK modulator are produced to a pair of mixers that also receive one of an in-phase and a quadrature local oscillation, respectively. The output of the mixers, as described in relation to FIG. 8, are summed by an adder, amplified, and radiated from an antenna.

Figure 10:
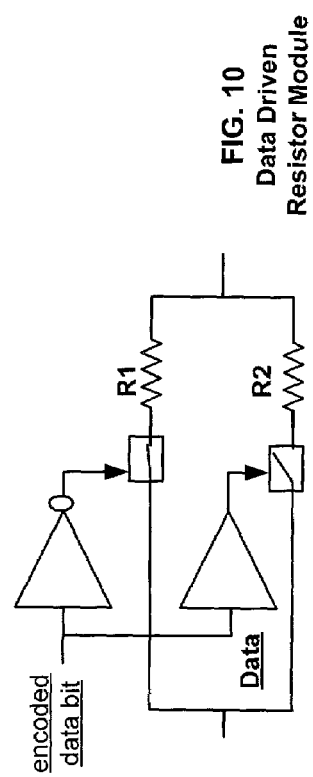
FIG. 10 is a functional schematic diagram that illustrates an embodiment of the present invention for producing modulated signals having a specified center frequency other than baseband.

FIG. 10 is a functional schematic diagram that illustrates an embodiment of the present invention for producing modulated signals having a specified center frequency other than baseband. The schematic of FIG. 10 illustrates a circuit and method for selecting between input resistors on the input side of either the first or second integrators as disclosed herein. As may be seen, one of a plurality of resistors may be switched into the input to the amplifier of the integrator thereby affecting the frequency of oscillation of the output signals from the integrator. The circuit of FIG. 10 is not used in those embodiments in which the modulator operates at baseband frequency. If, however, it is desirable to selectably operate at other frequencies as well, the configuration of FIG. 10 may be used to locate the center frequency at a frequency different than baseband. The variable capacitors shown throughout are for fine-tuning a frequency of oscillation of the various integrators. In one embodiment of the invention, the capacitors are automatically tuned to generate the desired frequency deviation on both sides of a center frequency. Generally, the frequency deviation is given by $1/(2*pi*R*C)$. For Bluetooth, the desired frequency deviation is ±160 kHz.

Figure 11:
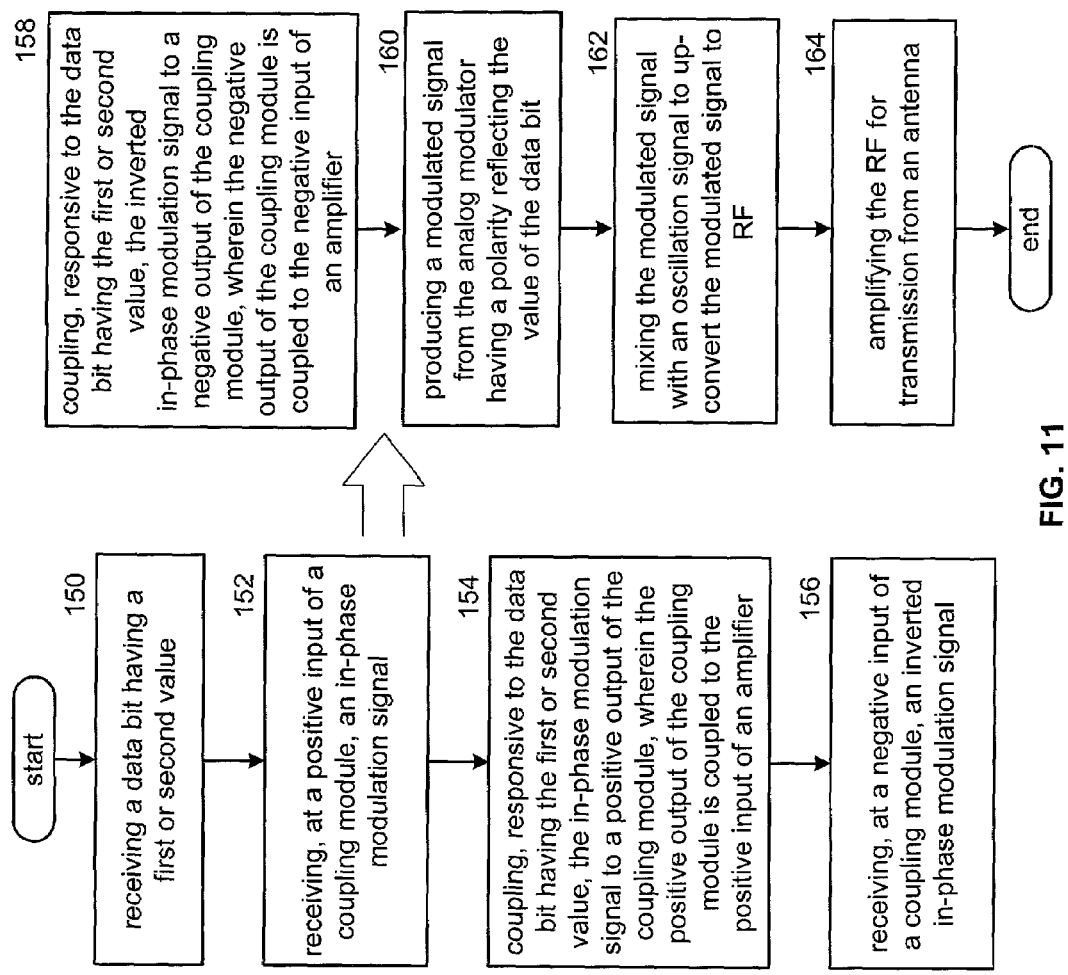
FIG. 11 is a flow chart illustrating a method for modulating and transmitting a signal according to one embodiment of the present invention.

FIG. 11 is a flow chart illustrating a method for modulating and transmitting a signal according to one embodiment of the present invention. The inventive method begins with receiving a data bit having either a first or a second value (step 150). The coupling modules also receives, at a first input of a coupling module, an in-phase modulation signal (step 152). The coupling module includes mixers and switches that can cross connect inputs or pass inputs straight through according to a value of a control signal. Accordingly, the invention further includes coupling, responsive to the data bit having the first value, the in-phase modulation signal to a positive output of the coupling module, wherein the positive output of the coupling module is coupled to the positive input of an amplifier (step 154).

The invention further includes receiving, at a negative (second) input of the coupling module, an inverted in-phase modulation signal (step 156). The coupling module further couples, responsive to the data bit having the first value, the inverted in-phase modulation signal to a negative output of the coupling module, wherein the negative output of the coupling module is coupled to the negative input of an amplifier (step 158). Because an amplifier of an integrator includes positive and negative inputs that are coupled to the positive and negative inputs of the coupling module, the coupled outputs of the coupling module are produced to the integrator where they are integrated.

Thus, the inventive method further includes producing a modulated signal from the analog modulator having a polarity reflecting the value of the data bit wherein the polarity is a function of the coupling performed by the coupling module according to the value of the data bit (step 160). The above example illustrated operation of the coupling module for the data bit having the first value. If the data bit has the second value, then the coupling module couples the second (negative) input to the positive output of the coupling module and vice-versa. Thus, the polarity of the quadrature modulated signal produced by the first integrator is inverted thereby inverting the output of the analog modulator.

The modulated signal produced by the analog modulator is then mixed with an oscillation signal to up-convert the modulated signal to RF (step 162). The final step includes amplifying the RF for transmission from an antenna (step 164).

While the above described method illustrated operation of the analog modulator and the relationship between an input in-phase modulation signal and the polarity of an output modulated signal, there are other steps included in producing an output modulated signal as is described below in reference to FIG. 12.

Figure 12:
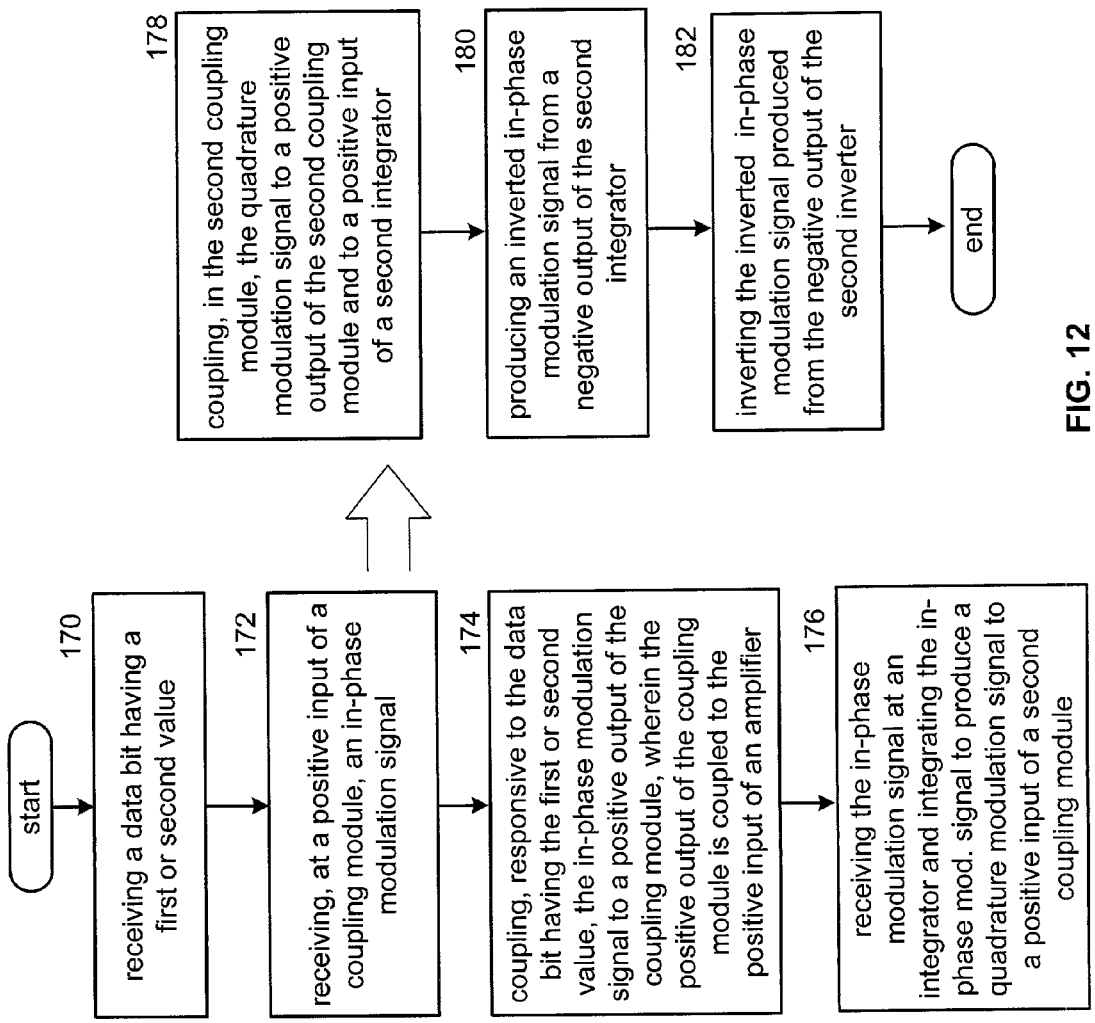
FIG. 12 is a flow chart illustrating one aspect of the inventive method.

FIG. 12 is a flow chart illustrating one aspect of the inventive method. The inventive method begins with receiving a data bit having either a first or a second value (step 170). The coupling modules also receives, at a first input of a coupling module, an in-phase modulation signal (step 172). The coupling module includes mixers and switches that can cross connect inputs or pass inputs straight through according to a value of a control signal. Accordingly, the invention further includes coupling, responsive to the data bit having the first value, the in-phase modulation signal to a positive output of the coupling module, wherein the positive output of the coupling module is coupled to the positive input of an amplifier of a first integrator (step 174).

Thereafter, the inventive process includes receiving the in-phase modulation signal at the positive input of the first integrator and integrating the in-phase modulated signal to produce a quadrature modulation signal to a positive input of a second coupling module (step 176). Thereafter, in the second coupling module, the quadrature modulation signal is coupled to a positive output of the second coupling module and to a positive input of an amplifier of the second integrator (step 178).

The second integrator integrates the quadrature modulation signals and produces an inverted in-phase modulation signal from a negative output of the second integrator (step 180). Thus, the inventive process concludes with inverting the inverted in-phase modulation signal produced from the negative output of the second inverter (step 182). The output(s) of the second integrator may be inverted by an inverter or by coupling the negative output of the second integrator to the negative input of the first coupling module and by coupling the positive output of the second integrator to the positive input of the first coupling module.

The invention disclosed herein is susceptible to various modifications and alternative forms. Specific embodiments therefore have been shown by way of example in the drawings and detailed description. It should be understood that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. An analog frequency shift keying (FSK) modulator comprises:

a first mixing module operably coupled to mix an encoded data bit with an in-phase modulation signal to produce a first mixed signal;

a first integrator operably coupled to integrate the first mixed signal to produce a quadrature modulation signal;

a second mixing module operably coupled to mix the encoded data bit with the quadrature modulation signal to produce a second mixed signal;

a second integrator operably coupled to integrate the second mixed signal to produce an inverted in-phase modulation signal; and an inverting module operably coupled to invert the inverted in-phase modulation signal to produce the in-phase modulation signal.

2. The analog FSK modulator of claim 1 wherein the first integrator includes an amplifier, a resistor and a capacitor, wherein a first input of the amplifier is coupled to a first node of the resistor and to a first node of the capacitor, an output of the amplifier is coupled to a second node of the capacitor, and a second input of the amplifier is coupled to a reference ground potential, wherein resistor and capacitor values are selected so that an RC time constant is approximately tuned to a frequency deviation.

3. The analog FSK modulator of claim 2 wherein the first mixing module comprises a switching module coupled to flip coupling of inputs of the amplifier based on a state of the encoded data bit.

4. The analog FSK modulator of claim 2 wherein the capacitor is variable.

5. The analog FSK modulator of claim 2 wherein the resistor is variable.

6. The analog FSK modulator of claim 2 wherein at least one of the resistor and capacitor of the first integrator is variable.

7. The analog FSK modulator of claim 6 wherein the amplifier of the first integrator is differential.

8. The analog FSK modulator of claim 6 wherein the first mixing module switches differential inputs of the differential amplifier of the first integrator based on a state of the encoded data bit.

9. The analog FSK modulator of claim 1 wherein the second integrator includes an amplifier, a resistor and a capacitor, a first input of the amplifier is coupled to a first node of the resistor and to a first node of the capacitor, an output of the amplifier is coupled to a second node of the capacitor, and a second input of the amplifier is coupled to a reference ground potential, wherein resistor and capacitor values are selected so that an RC time constant is approximately tuned to a frequency deviation.

10. The analog FSK modulator of claim 9 wherein the capacitor is variable.

11. The analog FSK modulator of claim 9 wherein the resistor is variable.

12. The analog FSK modulator of claim 9 wherein the second mixing module comprises a switching module coupled to flip coupling of inputs of the amplifier based on a state of the encoded data bit.

13. The analog FSK modulator of claim 9 wherein at least one of the resistor and capacitor of the second integrator is variable.

14. The analog FSK modulator of claim 9 wherein the amplifier of the second integrator is differential.

15. The analog FSK modulator of claim 14 wherein the second mixing module switches differential inputs of the differential amplifier of the second integrator based on a state of the encoded data bit.

16. The analog FSK modulator of claim 1 coupled to at least one Gaussian filter to filter the in-phase modulated signals produced by the analog FSK modulator.

17. A radio frequency (RF) transmitter, comprising:
an analog frequency shift keying (FSK) module operably coupled to FSK modulate an encoded data bit to produce an in-phase modulation signal and a quadrature modulation signal;
an up-conversion module operably coupled to mix the in-phase modulation signal with an in-phase component of a local oscillation to produce a first mixed signal, to mix the quadrature modulation signal with a quadrature component of the local oscillation to produce a second mixed signal, and to sum the first and second mixed signals to produce an up-converted signal; and
a power amplifier operably coupled to amplifier the up-converted signal to produce an RF signal, wherein the analog FSK module includes:
a first mixing module operably coupled to mix an encoded data bit with an in-phase modulation signal to produce a first mixed signal;
a first integrator operably coupled to integrate the first mixed signal to produce a quadrature modulation signal;
a second mixing module operably coupled to mix the encoded data bit with the quadrature modulation signal to produce a second mixed signal;
a second integrator operably coupled to integrate the second mixed signal to produce an inverted in-phase modulation signal; and
an inverting module operably coupled to invert the inverted in-phase modulation signal to produce the in-phase modulation signal.

18. The RF transmitter of claim 17 wherein the first integrator includes an amplifier, a resistor and a capacitor, wherein a first input of the amplifier is coupled to a first node of the resistor and to a first node of the capacitor, an output of the amplifier is coupled to a second node of the capacitor, and a second input of the amplifier is coupled to a reference ground potential, wherein resistor and capacitor values are selected so that an RC time constant is approximately tuned to a frequency deviation.

19. The RF transmitter of claim 18 wherein the first mixing module comprises a switching module coupled to flip coupling of inputs of the amplifier based on a state of the encoded data bit.

20. The RF transmitter of claim 18 wherein the capacitor is variable.

21. The RF transmitter of claim 18 wherein the resistor is variable.

22. The RF transmitter of claim 17 wherein the second integrator includes an amplifier, a resistor and a capacitor, a first input of the amplifier is coupled to a first node of the resistor and to a first node of the capacitor, an output of the amplifier is coupled to a second node of the capacitor, and a second input of the amplifier is coupled to a reference ground potential, wherein resistor and capacitor values are selected so that an RC time constant is approximately tuned to a frequency deviation.

23. The RF transmitter of claim 22 wherein the second mixing module comprises a switching module coupled to flip coupling of inputs of the amplifier based on a state of the encoded data bit.

24. The RF transmitter of claim 22 wherein the capacitor is variable.

25. The RF transmitter of claim 22 wherein the resistor is variable.

26. The RF transmitter of claim 17 wherein the amplifier of the first integrator is differential.

27. The RF transmitter of claim 26 wherein the first mixing module switches differential inputs of the differential amplifier of the first integrator based on a state of the encoded data bit.

28. The RF transmitter of claim 27 wherein the amplifier of the second integrator is differential.

29. The RF transmitter of claim 28 wherein at least one of the resistors and capacitor of the second integrator is variable.

30. The RF transmitter of claim 28 wherein the second mixing module switches differential inputs of the differential amplifier of the second integrator based on a state of the encoded data bit.

31. The RF transmitter of claim 27 wherein at least one of the resistor and capacitor of the first integrator is variable.

32. The RF transmitter of claim 17 coupled to at least one Gaussian filter to filter I and Q modulated signals produced by the analog FSK modulator.

* * * * *